(12) United States Patent
Heo

(10) Patent No.: US 7,574,317 B2
(45) Date of Patent: Aug. 11, 2009

(54) METHOD FOR CALIBRATING A FILTER, A CALIBRATOR AND SYSTEM INCLUDING THE SAME

(75) Inventor: Seung-Chan Heo, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/902,417

(22) Filed: Sep. 21, 2007

(65) Prior Publication Data

US 2008/0088364 A1 Apr. 17, 2008

(30) Foreign Application Priority Data

Oct. 13, 2006 (KR) .................. 10-2006-0099777

(51) Int. Cl.
*G01R 35/00* (2006.01)
*G01R 27/28* (2006.01)

(52) U.S. Cl. .................. 702/107; 702/117; 702/125; 327/552; 327/553; 327/554

(58) Field of Classification Search ............. 702/89–91, 702/106–107, 117, 125; 341/120–121; 327/552–554
See application file for complete search history.

(56) References Cited

U.S. PATENT DOCUMENTS

| | | | | | |
|---|---|---|---|---|---|
| 3,654,563 | A | * | 4/1972 | Hesler et al. ............. | 327/552 |
| 4,858,159 | A | * | 8/1989 | Wheelwright et al. ...... | 702/106 |
| 5,914,633 | A | * | 6/1999 | Comino et al. ............ | 327/553 |
| 6,803,813 | B1 | * | 10/2004 | Pham ...................... | 327/553 |
| 6,885,181 | B1 | * | 4/2005 | Roo ....................... | 324/76.28 |
| 2001/0045864 | A1 | * | 11/2001 | Kimppa et al. ............ | 327/553 |
| 2002/0168952 | A1 | * | 11/2002 | Vishakhadatta et al. ..... | 455/130 |
| 2003/0090316 | A1 | * | 5/2003 | Dathe et al. .............. | 327/554 |
| 2004/0169565 | A1 | * | 9/2004 | Gaggl et al. .............. | 333/17.1 |
| 2004/0260500 | A1 | * | 12/2004 | Punzenberger et al. ...... | 702/107 |
| 2005/0118980 | A1 | * | 6/2005 | Pai et al. ................. | 455/340 |
| 2005/0253646 | A1 | * | 11/2005 | Lin ....................... | 327/553 |

(Continued)

OTHER PUBLICATIONS

A.M. Durham et al. "Circuit Architectures for High Linearity Monolithic Continuous-Time Filtering" Analog and digital signal processing, vol. 39, No. 9, Sep. 1992, pp. 651-657.

(Continued)

*Primary Examiner*—Eliseo Ramos Feliciano
*Assistant Examiner*—Mi'schita' Henson
(74) *Attorney, Agent, or Firm*—Harness Dickey & Pierce

(57) ABSTRACT

An example embodiment provides a method for calibrating an active RC filter and RC time constant calibrator for an active RC filter. The RC time contact calibrator includes a RC timer and a calibration code generator. The RC timer outputs a holding signal based on a comparison of a first output signal and a second output signal. The holding signal output by the RC timer causes a digital count value to be compared to a digital target value. The calibration code generator generates a slope control code and a flag signal based on the comparison of the digital count value and the digital target value and outputs the slope control code as a calibration code based on the flag signal. The slope control code controls the slope of the first output signal and the slope of the second output signal.

24 Claims, 7 Drawing Sheets

U.S. PATENT DOCUMENTS

2006/0001559 A1* 1/2006 Tuttle et al. .................. 341/120
2006/0132339 A1* 6/2006 Alon et al. ................... 341/120
2007/0025146 A1* 2/2007 Huang ...................... 365/185.2
2007/0207760 A1* 9/2007 Kavadias et al. ............ 455/255

OTHER PUBLICATIONS

A.M. Durham et al. "Low Distortion VLSI Compatible Self-Tuned Continuous-Time Monolithic Filters." IEEE, 1991, pp. 1448-1451.

* cited by examiner

METHOD FOR CALIBRATING A FILTER, A CALIBRATOR AND SYSTEM INCLUDING THE SAME

PRIORITY STATEMENT

This application claims the priority of Korean Patent Application No. 2006-0099777 filed on Oct. 13, 2006 in the Korean Intellectual Property Office, the entire contents of which is incorporated herein by reference.

BACKGROUND

1. Field of the Invention

Example embodiments relate to a calibrator for a filter and method for calibrating a filter. In particular, example embodiments relate to a calibrator for variably adjusting a time constant for an active Resistor-Capacitor (RC) filter and a method for calibrating an active RC filter.

2. Description of the Related Art

A signal processing system generally includes filters, which are used to reduce and/or remove unwanted components of a signal. Alternatively, filters may be used to enhance the desired components of the signal. In either case, filters play an important role in signal processing systems.

One characteristic of a filter is referred to as the cut-off frequency of the filter. For a high-pass or low-pass filter, the cut-off frequency of the filter corresponds to the frequency at which the output level of the filter decreases by about 3 dB. The cut-off frequency is generally represented by Equation (1) below, wherein f represents the cut-off frequency and $\tau$ represents the time constant of a RC circuit.

$$f = \frac{1}{2\pi\tau} \quad (1)$$

Equation (2) is also helpful in relating the cut-off frequency to a RC circuit.

$$\tau = RC \quad (2)$$

In Equation (2), R represents the resistance value in ohms of the filter and C represents the capacitance value in farads of the filter. Both the resistance value R and the capacitance value C are affected by external circumstances such as temperature, for example. As such, there are advantages to having filters, in which the cut-off frequency is variably adjusted to accommodate for external circumstances affecting the operation of a filter. Further, some signal processing systems require that a cut-off frequency of one or more filters included in the signal processing systems is variable.

As such, tunable filters have been designed that can be tuned to accommodate for external circumstances, such as temperature, as well as process variations that may result in a filter not operating according to a desired fixed time-constant. These tunable filters may be tuned based on a tuning code provided by a calibrator.

One example of a conventional calibrator for tuning a tunable filter is described in the article titled "Circuit Architectures for High Linearity Monolithic Continuous-Time Filtering" authored by A. M. Durham et al. and published in IEEE TRANSACTIONS ON CIRCUITS AND SYSTEMS—II: Analog and Digital Signal Processing, vol. 39, no. 9, September 1992. A tuning code provided by conventional calibrators, such as the conventional calibrator described in the above article, is generally output based on a comparison of two analog signals. For example, the conventional calibrator described in the above article provides a tuning code once an output voltage of the calibrator corresponds to an analog ground voltage. However, these analog signals are generally directly or indirectly provided based on one or more reference voltages.

While conventional calibrators provide tuning codes intended to correct for the affects of external circumstances on various components, such as resistors, capacitors and operational amplifiers, these conventional calibrators generally do not consider the affects of the external circumstances and/or process variations on the reference voltages used by the calibrators to generate the tuning codes. If the one or more reference voltages used in conventional calibrators to provide a tuning code are affected by external circumstances, not accounted for by the calibrator, the tuning code provided by the conventional calibrators may not be as accurate as desired.

SUMMARY

Example embodiments provide a calibrator for variably adjusting a time constant for a RC active filter and a method for calibrating an active RC filter.

An example embodiment provides a RC time constant calibrator for an active RC filter. The RC time contact calibrator includes a RC timer and a calibration code generator. The RC timer outputs a holding signal based on a comparison of a first output signal and a second output signal. The first output signal and the second output signal are amplified signals, which correspond to a first reference voltage and a second reference voltage, respectively. The holding signal output by the RC timer causes a digital count value to be compared to a digital target value. The calibration code generator generates a slope control code and a flag signal based on the comparison of the digital count value and the digital target value and outputs the slope control code as a calibration code based on the flag signal indicating the digital count value corresponds to the digital target value. The slope control code controls the slope of the first output signal and the slope of the second output signal.

An example embodiment provides a RC timer. The RC timer includes a reference voltage generator generating a first reference voltage and a second reference voltage from a supply voltage, a differential amplifier receiving the first reference voltage and the second reference voltage and outputting a first output signal and a second output signal; a first slope capacitor varying a slope of the first output signal, a second slope capacitor varying a slope of the second output signal, and a holding signal generator comparing the first output signal and the second output signal and outputting a holding signal based on an output signal comparison result.

An example embodiment provides a calibration code generator. The calibration code generator includes a target identifying component, a calibration code adjusting component, a register, and a flag register. The target identifying component receives a holding signal, a digital count value, which is based on an internal clock, and a digital target value; sets the digital count value based on the holding signal; compares the stored digital count value with the digital target value; and outputs a count value comparison result. The calibration code adjusting component generates a slope control code based on the count value comparison result and outputs the slope control code to the first register. The first register stores the slope control code received from the calibration code adjusting component and outputs the slope control code as a calibration code. The flag register outputs a flag signal to instruct the first register to output the slope control code as the calibration code to an active RC filter.

An example embodiment provides a method for calibrating an active RC filter. The method includes varying a slope of a first output signal and a slope of a second output signal, identifying the crossing point of the first output signal and the second output signal, determining if the identified crossing point matches a target point corresponding to a digital target value, and providing a calibration code to the active RC filter if the crossing point matches the target point. The first output signal and the second output signal are amplified and/or buffered signals corresponding to a first reference voltage and a second reference voltage, respectively. The slope of the first output signal is inversely related to the slope of the second output signal.

An example embodiment provides a communication device. The communication device includes a receiving stage and a filtering stage, which includes an active RC filter and a calibrator. The calibrator varies a slope of a first output signal and a slope of a second output signal, which are inversely related, and respectively correspond to a first reference voltage and a second reference voltage, identifies a crossing point of the first output signal and the second output signal, determines if the identified crossing point matches a target point corresponding to a digital target value, and provides a calibration code to the active RC filter if the crossing point matches the target point. The filter filters the received at least one signal based on the calibration code received from the calibrator.

Example embodiments provide an RC time constant calibrator and related method, which may provide a time constant calibration code set according to a digital target value and may reduce and/or eliminate the affects of external circumstances and/or process variations on a reference voltage used in generating the time constant calibration code.

BRIEF DESCRIPTION OF THE DRAWINGS

The above and other aspects and advantages of the present invention will become more apparent by describing in detail example embodiments thereof with reference to the attached drawings in which.

DETAILED DESCRIPTION OF EXAMPLE EMBODIMENT

Various example embodiments are now described more fully with reference to the accompanying drawings in which some example embodiments of the invention are shown. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present invention.

It will be understood that when a component is referred to as being "connected" or "coupled" to another component, it can be directly connected or coupled to the other component or intervening components may be present. In contrast, when a component is referred to as being "directly connected" or "directly coupled" to another component, there are no intervening components present. Other words used to describe the relationship between components should be interpreted in a similar manner (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, unless the context clearly indicates otherwise.

Example embodiments will now be described in detail with reference to the attached drawings.

Figure 1:
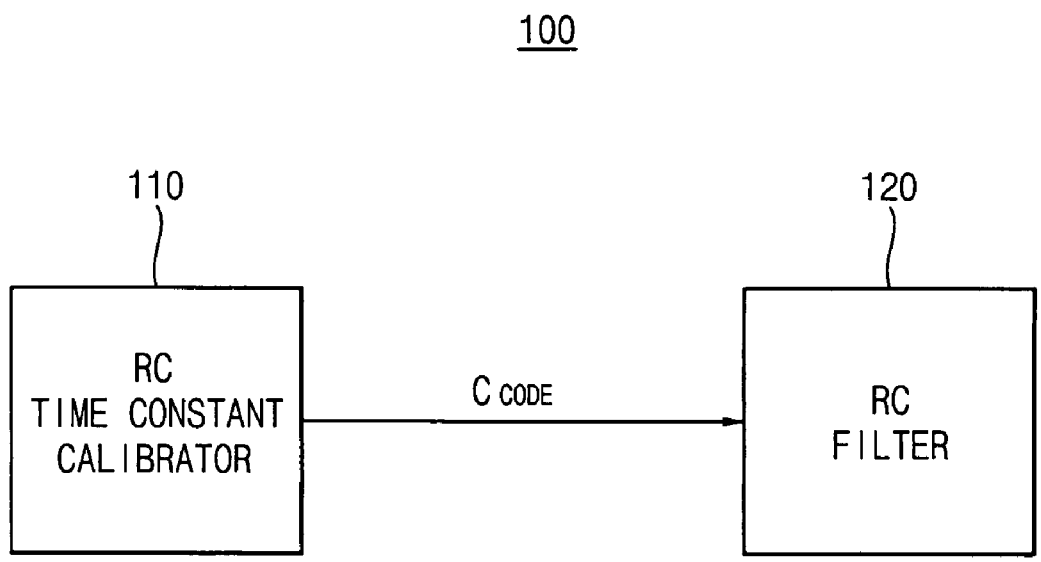
FIG. 1 illustrates an example embodiment of a RC time constant calibrator that provides a time constant calibration code to a RC filter.
Figure 2:
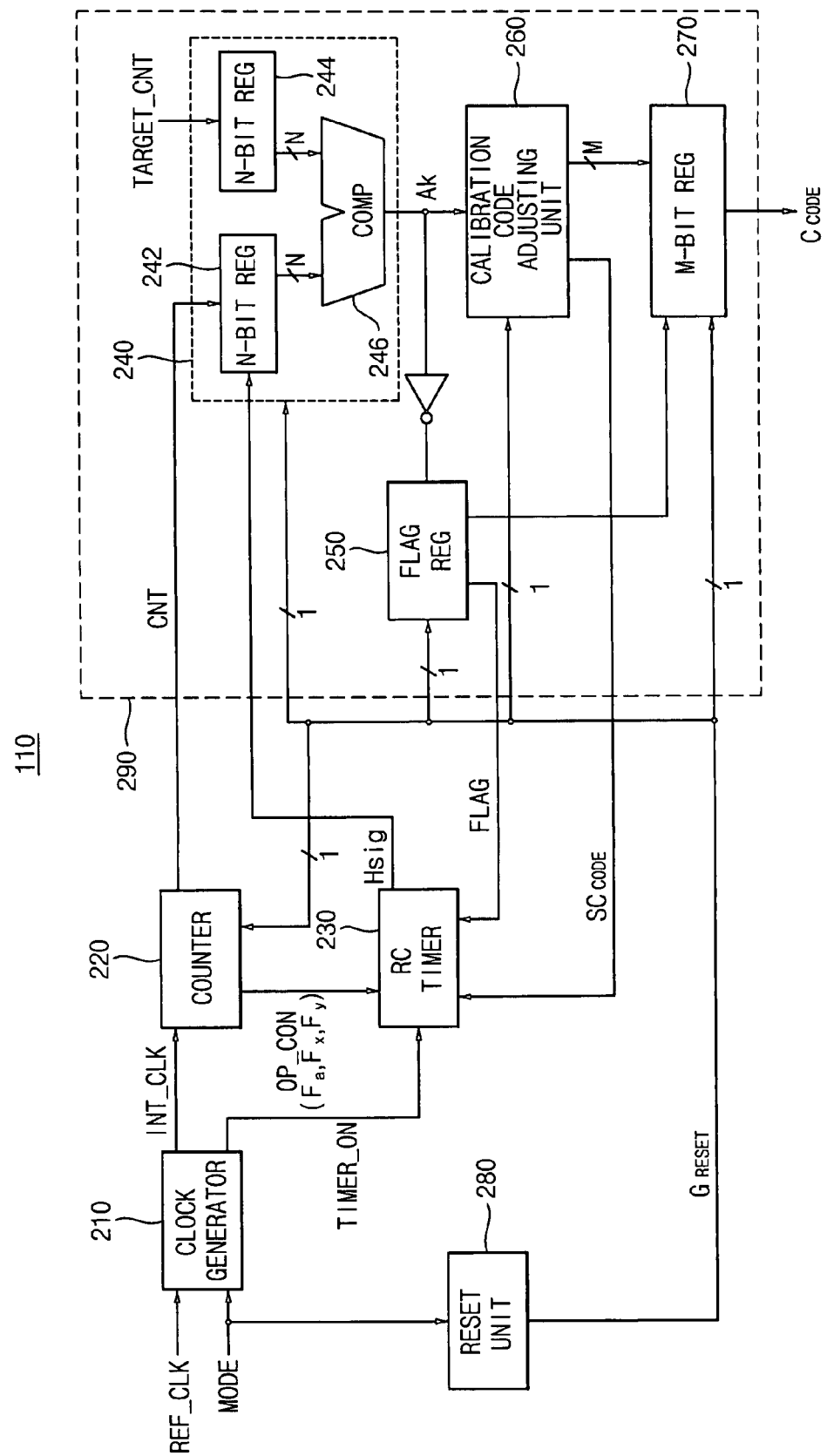
FIG. 2 is a block diagram of an example embodiment of the RC time constant calibrator.

Referring to FIG. 1, an example embodiment of a RC time constant calibrator 110 provides a time constant calibration code $C_{CODE}$ to a RC filter 120. The RC filter 120 is a tunable filter as is well-known in the art and thus, the specifics of the RC filter 120 will not be further discussed herein for the sake of brevity. FIG. 2 is a block diagram of an example embodiment of the RC time constant calibrator 110.

Referring to FIG. 2, the RC time constant calibrator 110 includes a clock generator 210, an N counter 220, a RC timer 230, a reset unit 280, and a calibration code generator 290. Each of these components is described in greater detail below under a corresponding sub-heading.

I. Clock Generator 210

The clock generator 210 receives an external clock signal REF_CLK and a mode signal MODE, generates an internal clock signal INT_CLK based on the external reference clock REF_CLK and the mode signal MODE, and outputs the internal clock signal INT_CLK to the N counter 220. The external reference clock REF_CLK is a clock signal used to synchronize several different circuits of a semiconductor device. The internal clock signal INT_CLK is a clock signal generated from the external reference clock REF_CLK and is used to synchronize a subset of the several different circuits of the semiconductor device. For example, the internal clock signal INT_CLK is the clock signal used in the RC time constant calibrator 110, whereas the external reference clock signal REF_CLK may be used to generate the internal clock signal INT_CLK of the RC time constant calibrator 110 as well as an internal clock signal of an the active RC filter 120. The clock generator 210 of the RC time constant calibrator 110 also generates and outputs a timing signal TIMER_ON to the RC timer 230. The timing signal TIMER_ON may be used to activate and deactivate the RC timer 230. The use of these signals is further explained later with respect to the timing diagram of FIG. 5.

II. N Counter 220

The N counter 220 generates a counter value CNT and operation control signals OP_CON based on the internal clock signal INT_CLK received from the clock generator 210. The counter value CNT provided by the N counter 220 is an N-bit value (N is a positive integer), and the N counter 220 counts from a minimum value to a maximum value based on the internal clock signal INT_CLK. For example, if the minimum value is 0 and the maximum value is 255, the N counter 220 repeatedly counts from 0 to 255. As shown in FIG. 2, the N counter 220 provides the counter value CNT to a first N-bit register 242 of the calibration code generator 290. The counter value CNT stored in the first N-bit register 242 is compared to a digital target value TARGET_CNT. The digital target value TARGET_CNT may be a desired and/or predetermined value input by an end user or manufacturer to identify an appropriate calibration code for the active RC filter 120. The comparison of the digital target value TARGET_CNT and the counter value CNT is described in greater detail below with respect to FIGS. 4-6.

The operation control signals OP_CON generated by the N counter 220 include a reset signal $F_x$, an initialization signal $F_y$, and an operation signal $F_a$. Each of these operation control signals is based on the count value CNT generated by the N counter 220. For example, the reset signal $F_x$, causes the RC timer 230 to reset, the initialization signal $F_y$ is used to initialize the RC timer 230 following a reset operation, and the operation signal control $F_a$ is used to instruct the RC timer 230 to operate. Accordingly, the operation control signals are provided to the RC timer 230 and control the operation of the RC timer 230 as is described in greater detail later with respect to the timing diagram of FIG. 5.

III. Reset Unit 280

The reset unit 280, as shown in FIG. 2, receives the mode signal MODE and generates a global reset signal $G_{RESET}$ used to reset the RC time constant calibrator 110. The mode signal MODE may be used to activate and deactivate the clock generator 210. For example, if the mode signal MODE is in a first state the clock generator 210 may generate the internal clock signal INT_CLK from the external clock signal REF_CLK, whereas the clock generator may be deactivated if the mode signal MODE is in a second state. For example, the global reset signal $G_{RESET}$ may reset the RC time constant calibrator 110 according to default settings originally set by a manufacturer. The global reset signal $G_{RESET}$ is provided to the N counter 220 and the calibration code generator 290. Like the operation control signals OP_CON mentioned above, examples of the mode signal MODE and global reset signal $G_{RESET}$ are illustrated in the timing diagram of FIG. 5.

IV. RC Timer 230

Referring to FIG. 2, the RC timer 230 receives a plurality of input signals and generates a holding signal $H_{sig}$, which is provided to the calibration code generator 290. In particular, the RC timer 230 receives the reset signal $F_x$, the initialization signal $F_y$, and the operation signal $F_a$ from the N counter 220; the timing signal TIMER_ON from the clock generator 210; and a flag signal FLAG and a slope control code $SC_{CODE}$ from the calibration code generator 290. An example configuration and the operation of the RC timer 230 is now described in greater detail with respect to FIGS. 3 and 5.

Figure 3:
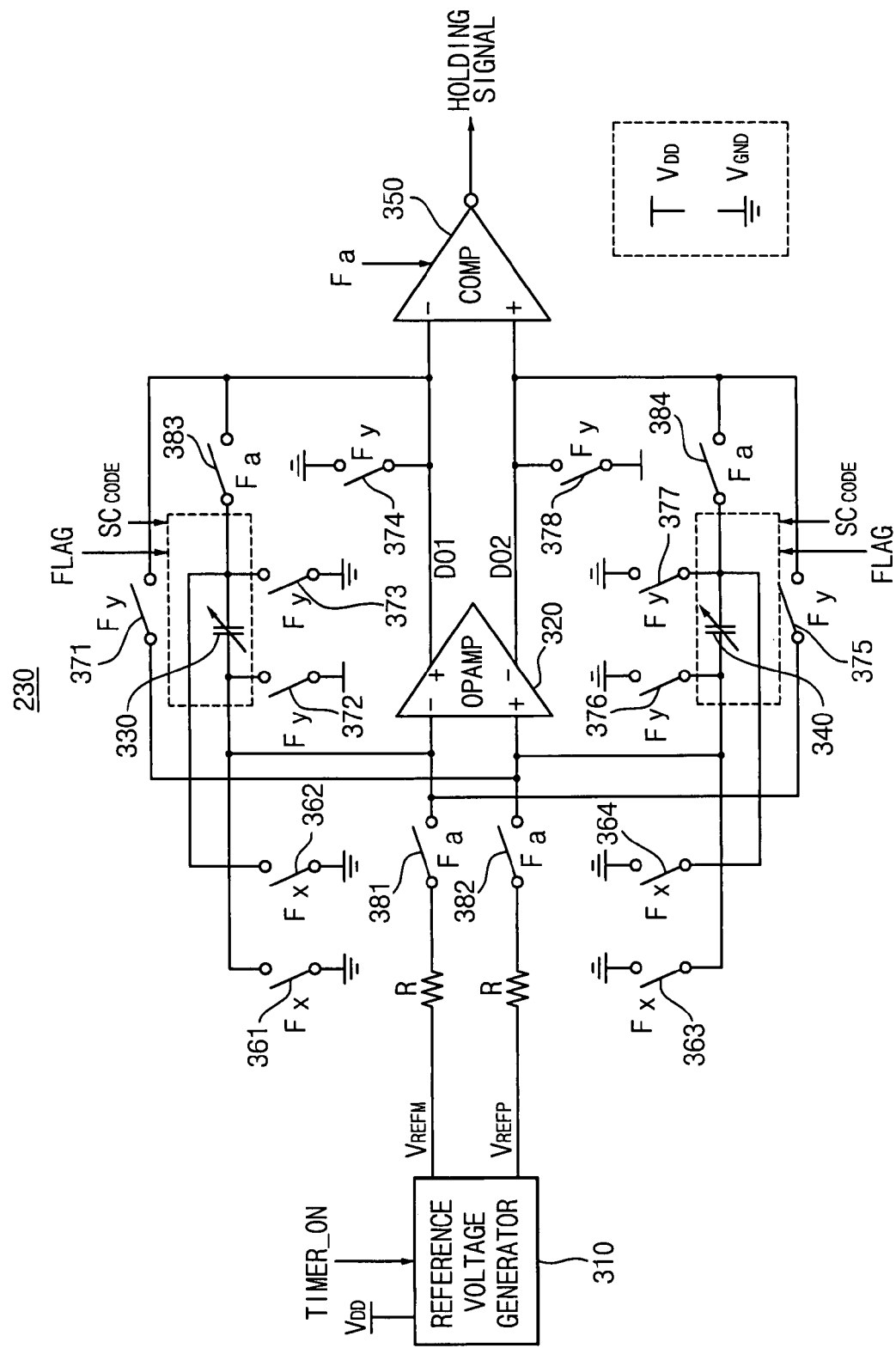
FIG. 3 is an example embodiment of an RC timer 230 included in a RC time constant calibrator.

Referring to FIG. 3, an example embodiment of an RC timer 230 includes a reference voltage generator 310, a differential amplifier 320, a first slope capacitor 330, a second slope capacitor 340, and a holding signal generator 350.

A. Reference Voltage Generator 310

The reference voltage generator 310 of the RC timer 230 receives the timing signal TIMER_ON and a supply voltage $V_{DD}$. The reference voltage generator 310 generates a first reference voltage $V_{REFM}$ and a second reference voltage $V_{REFP}$ from the supply voltage $V_{DD}$ when the timing signal TIMER_ON is in a first state. For example, the first state may be a high state as shown in the timing diagram of FIG. 5. The reference voltage generator 310 is deactivated if the timing signal TIMER_ON is in a second state, e.g., a low state. As shown in FIG. 3, the first reference voltage $V_{REFM}$ and a second reference voltage $V_{REFP}$ are connected to an inverting input terminal of the differential amplifier 320 and a non-inverting input terminal of the differential amplifier 320, respectively. According to an example embodiment, because the reference voltage generator generates the first reference voltage $V_{REFM}$ and the second reference voltage $V_{REFP}$ from the same supply voltage $V_{DD}$, the difference between the first reference voltage $V_{REFM}$ and the second reference voltage $V_{REFP}$ is relatively constant. Stated differently, according to an example embodiment, the difference between the first reference voltage $V_{REFM}$ and the second reference voltage $V_{REFP}$ is substantially unaffected by external circumstances and process variations.

B. Differential Amplifier 320

The differential amplifier 320 receives the first reference voltage $V_{REFM}$ and the second reference voltage $V_{REFP}$ from the reference voltage generator 310 and provides a first output signal D01 and a second output signal D02 to the holding signal generator 350. The first output signal D01 and the second output signal D02 are amplified and/or buffered signals corresponding the first reference voltage $V_{REFM}$ and second reference voltage $V_{REFP}$, respectively. As shown in FIG. 3, there are various switches directly and indirectly connected to the differential amplifier 320, the first slope capacitor 330 and the second slope capacitor 340 affecting the operation of the differential amplifier 320, the first slope capacitor 330 and the second slope capacitor 340. These various switches are described below in conjunction with the differential amplifier 320, first slope capacitor 330 and the second slope capacitor 340.

Referring to FIG. 3, the first reference voltage $V_{REFM}$ output by the reference voltage generator 310 is provided to the inverting input terminal of the differential amplifier 320 via a resistor R and an operational switch 381. Similarly, the second reference voltage $V_{REFP}$ output by the reference voltage generator 310 is provided to the non-inverting input terminal of the differential amplifier 320 via a resistor R and a second operational switch 382. Both the first operational switch 381 and the second operational switch 382 are controlled by the operation signal $F_a$ received from the N counter 220.

If the operation signal $F_a$ is in a first state, the first operational switch 381 and the second operational switch 382 are closed, thereby allowing the inverting input terminal of the differential amplifier 320 to receive the first reference voltage $V_{REFM}$ and the non-inverting input terminal of the operation amplifier 320 to receive the second reference voltage $V_{REFP}$.

Alternatively, if the operation signal $F_a$ is in a second state, the first operational switch 381 and the second operational switch 382 are open, thereby preventing the inverting input terminal of the differential amplifier 320 from receiving the first reference voltage $V_{REFM}$ and the non-inverting input terminal of the operation amplifier 320 from receiving the second reference voltage $V_{REFP}$.

C. First Slope Capacitor 330 and Second Slope Capacitor 340

Still referring to FIG. 3, the non-inverting output terminal of the differential amplifier 320 is connected to the inverting input terminal of the differential amplifier 320 via the first slope capacitor 330 and a third operational switch 383. The first slope capacitor 330 is a variable capacitor, which is varied based on a slope control code $SC_{CODE}$ and a flag signal FLAG received from the calibration code generator 290. In particular, if the flag signal FLAG is in a first state, the variable capacitor varies based on the slope control code $SC_{CODE}$, whereas if the flag signal FLAG is in a second state the first slope capacitor 330 does not vary so that the capacitance value of the first slope capacitor 330 is maintained.

Further, the inverting output terminal of the differential amplifier 320 is connected to the non-inverting input terminal of the differential amplifier 320 via the second slope capacitor 340 and a fourth operational switch 384. Similar to the first slope capacitor 330, the capacitance value of the second slope capacitor 340 is controlled based on the flag signal FLAG and the slope control code $SC_{CODE}$ received from the calibration code generator 290. For example, if the flag signal FLAG is in the first state, the capacitance value of the second slope capacitor 340 varies according to the slope control code $SC_{CODE}$, whereas if the flag signal FLAG is in the second state, a capacitance value of the second slope capacitor 340 does not vary.

Stated differently, if the flag signal FLAG is in the second state, the capacitance values of the first slope capacitor 330 and the second slope capacitor 340 are unaffected by receiving a slope control code $SC_{CODE}$. Further, if the flag signal FLAG is in the first state, the capacitance values of the first slope capacitor 330 and the second slope capacitor 340 vary based on the slope control code $SC_{CODE}$. Setting a capacitance value of a variable capacitor, such as the first and second slope capacitors 330 and 340, according to a digital code is well known in the art. As such, the specifics of setting the capacitance values of the first slope capacitor 330 and the second slope capacitor 340 based on the slope control code $SC_{CODE}$ are not discussed herein for the sake of brevity.

Like the first and second operational switches 381 and 382, the third operational switch 383 and the fourth operational switch 384 connected to the first slope capacitor 330 and the second slope capacitor 340, respectively, are switched based on the operation signal $F_a$ received from the N counter 220. As such, if the operation signal $F_a$ received from the N-bit counter 220 is in a first state, the third operational switch 383 and the fourth operational switch 384 are closed, whereas if the operation signal $F_a$ is in a second state, both the third operational switch 383 and the fourth operational switch 384 are open.

Further, the non-inverting output terminal of the differential amplifier 320 is connected to the non-inverting input of the differential amplifier 320 via a first initialization switch 371. Similarly, the inverting output terminal of the differential amplifier 320 is connected to the inverting input terminal of the differential amplifier 320 via a second initialization switch 375. In addition to the first initialization switch 371 and the second initialization switch 375, the RC timer 230 includes a third initialization switch 372, a fourth initialization switch 373, a fifth initialization switch 374, a sixth initialization switch 376, a seventh initialization switch 377 and an eighth initialization switch 378. The third initialization switch 372 is connected between a first terminal of the slope capacitor 330 and the supply voltage $V_{DD}$. The first terminal of the first slope capacitor 330 is the terminal of the first slope capacitor 330 connected to the inverting input terminal of the differential amplifier 320. The fourth initialization switch 373 is connected between the second terminal of the first slope capacitor 330 and ground. The second terminal of the first slope capacitor 330 is connected to the non-inverting output terminal of the differential amplifier 320 via the operational switch 383. The fifth initialization switch 374 is connected between the non-inverting output terminal and ground. The sixth initialization switch 376 is connected between the first terminal of the second slope capacitor 330 and ground. The first terminal of the second slope capacitor 340 is the terminal of slope capacitor 340 connected to the non-inverting input terminal of the differential amplifier 320. The seventh initialization switch 377 is connected between the second terminal of the second slope capacitor 340 and ground. The second terminal of the second slope capacitor 340 is connected to the inverting output terminal D02 of the differential amplifier 320 via the fourth operational switch 384. The eighth initialization switch 378 is connected between the inverting output terminal and the supply voltage $V_{DD}$. Each of the initialization switches is controlled based on the initialization signal $F_y$ provided by the N counter 220.

The example configuration of the RC timer 230 illustrated in FIG. 3 also includes a plurality of reset switches controlled by the reset signal $F_x$ received from the N counter 220. Referring to FIG. 3, the RC timer 230 includes a first reset switch 361, a second reset switch 362, a third reset switch 363 and a fourth reset switch 364. The first reset switch 361 is connected between the first terminal of the first slope capacitor 330 and ground, and the second reset switch 362 is connected between the second terminal of the first slope capacitor 330 and ground. The third reset switch 363 is connected between the first terminal of the second slope capacitor 340 and ground, and the fourth reset switch 364 is connected between the second terminal of the second slope capacitor 340 and ground. The first through fourth reset switches 361-364 are closed and function to discharge the first and second slope capacitors 330 and 340 when the reset signal $F_x$ is in a first state. Alternatively, the first through fourth reset switches 361-364 are open when the reset signal is in a second state.

D. Holding Signal Generator 350

In addition to the reference voltage generator 310, the differential amplifier 320, the first slope capacitor 330, the second slope capacitor 340 and the various switches described above, the RC timer 230 includes the holding signal generator 350. The holding signal generator 350 receives the operation signal $F_a$, as well as the first output signal D01 and the second output signal D02 provided by the differential amplifier 320. The holding signal generator 350 compares values of the first output signal D01 and values of the second output signal D02 to identify a crossing point of the first and second output signals when the operation signal $F_a$ is in the first state. The function of the holding signal generator 350 will be explained later in detail with respect to the timing diagram illustrated in FIG. 5.

V. Calibration Code Generator 290

Referring back to FIG. 2, the example embodiment of the time constant calibrator 110 also includes a calibration code generator 290. The calibration code generator 290 receives the count value CNT from the N counter 220, the holding signal $H_{sig}$ from the RC timer 230 and the global reset signal $G_{RESET}$ from the reset unit 280. Based on these signals, the calibration code generator 290 generates a calibration code $C_{CODE}$, which may be output to the RC filter 120. In FIG. 2, the calibration code generator 290 includes a target identifying component 240, a flag register 250, a calibration code adjusting unit 260 and an M-bit register 270.

A. Target Identifying Component 240

The target identifying component 240 includes a first N-bit register 242, a second N-bit register 244 and a comparator 246. The first N-bit register 242 receives the holding signal $H_{sig}$ from the RC timer 230 and the count value CNT from the N counter 220. The N-bit register 242 stores the count value CNT provided by the N counter 220, and outputs the stored count value CNT to the comparator 246 based on the holding signal $H_{sig}$. For example, a value stored in the first N-bit register 242 will continue to update as the count value CNT provided by the N counter 220 updates while the holding signal $H_{sig}$ is in a first state. However, if the holding signal $H_{sig}$ transitions from the first to a second state, the value stored in the first N-bit register 242 during the transition is maintained and later output to the comparator 246, or alternatively, the value stored in the first N-bit register 242 during the transition is substantially, immediately output to the comparator 246.

The second N-bit register 244 receives a digital target value TARGET_CNT. The digital target value TARGET_CNT may be a desired and/or predetermined value input by an end user or manufacturer. Like the first N-bit register 242, the second N-bit register 244 provides a value stored in the N-bit register to the comparator 246.

Both the first N-bit register 242 and the second N-bit register 244 provide a stored value including N bits to the comparator 246. As such, the comparator 246 receives the N-bit values from the first and second N-bit registers 242 and 244 and outputs a comparator signal Ak indicating whether or not the output value of the first N-bit register 242 matches the output value of the second N-bit register 244. According to an example embodiment, the value of the comparator signal Ak indicates one of the following: (i) the value of the first N-bit register 242 equals the value of the second N-bit register 244; (ii) the value of the first N-bit register 242 is less than the value of the second N-bit register 244; or (iii) the value of the first N-bit register is greater than the value of the second N-bit register 244. The comparator signal Ak is provided to the flag register 250 and the calibration code adjusting unit 260 described below.

B. Flag Register 250

The flag register 250 processes the comparator signal Ak and outputs a flag signal FLAG to the RC timer 230 and the M-bit register 270. The flag signal FLAG is used to stop the first and second slope capacitors 330 and 340 of the RC timer 230 from varying according to a received slope control code $SC_{CODE}$. The flag signal FLAG is also used to instruct the M-bit register 270 to output a code stored in the M-bit register 270 as the time constant calibration code $C_{CODE}$. As shown in FIG. 1 and previously described, the time constant calibration code $C_{CODE}$ is provided to the RC filter 120 to tune the RC filter 120.

C. Calibration Code Adjusting Unit 260

The calibration code adjusting unit 260 receives the comparator signal Ak and generates a slope control code $SC_{CODE}$ based on the received comparator signal Ak. The slope control code $SC_{CODE}$ is used to control the capacitance values of the first and second slope capacitors 330 and 340 of the RC timer 230. In particular, the slope control code $SC_{CODE}$ controls the capacitance values of the first and slope capacitors 330 and 340 and thus, affects the slope of the first output signal D01 and the second output signal D02 of the differential amplifier 320.

D. M-bit Flag Register 270

The M-bit register 270 receives a flag signal FLAG from the flag register 250 and a slope control code $SC_{CODE}$ from the calibration code adjusting unit 260. The M-bit register 270 stores a slope control code $SC_{CODE}$ received from the calibration code adjusting unit 260 until the M-bit register 270 is instructed to output a stored slope control code $SC_{CODE}$ to the RC filter 120 as the calibration code $C_{CODE}$.

VI. Method for Calibrating a RC Filter

Figure 4:
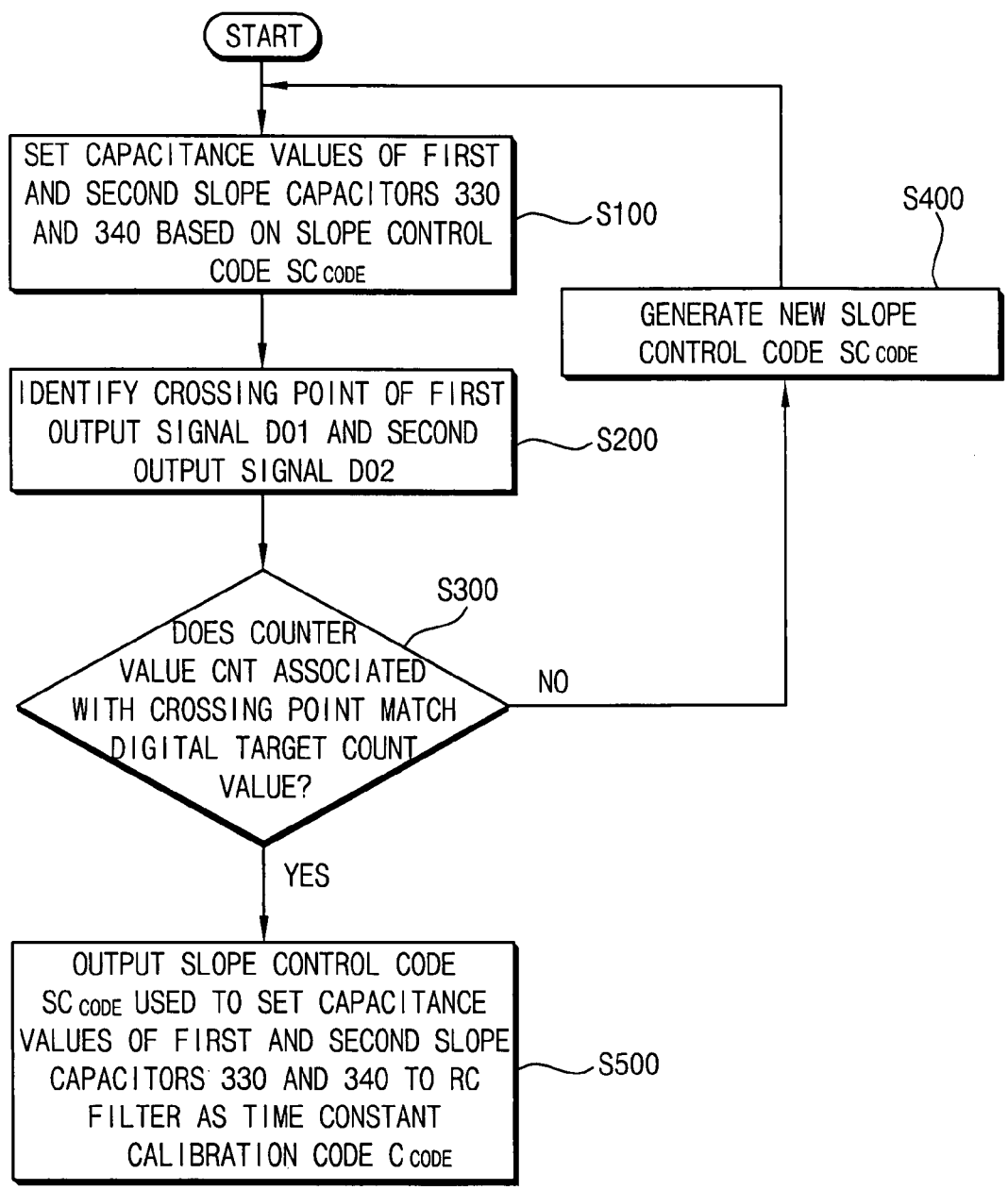
FIG. 4 is a flowchart illustrating an example embodiment of a method for calibrating an active RC filter.

FIG. 4 is a flowchart illustrating an example embodiment of a method for calibrating an active RC filter. The steps illustrated in the flow chart of FIG. 4 are performed by interactions between various components of the example embodiment of the time constant calibrator 110 previously described.

In step S100, capacitance values of the first and second slope capacitors 330 and 340 of the RC timer 230 are set according to a slope control code $SC_{CODE}$ provided by the calibration code adjusting unit 260 of the calibration code generator 290. In step S200, a crossing point of the first output signal D01 and the second output signal D02 of the differential amplifier 320 of the RC timer 230 is identified by the holding signal generator 350 of the RC timer 230. In step S300, the comparator 246 determines if the value output from the first N-bit register, which corresponds to a crossing point identified by a transition of the holding signal $H_{sig}$ received by the first N-bit register 242, matches the digital target value stored in the second N-bit register 244 of the target identifying component 240. If the value output from the first N-bit register 242 does not match the digital target value stored in the second N-bit register 244, a new slope control code $SC_{CODE}$ is generated by the calibration code adjusting unit 260 in step S400, and the method returns to step S1100. Alternatively, if the value output from the first N-bit register 242 does match the digital target value stored in the second N-bit register 244, the slope control code $SC_{CODE}$ used in step S100 to set the capacitance values of the first and second slope capacitors 330 and 340 is output to the RC filter 120 as the time constant calibration code $C_{CODE}$ in step S500.

VII. Example Timing Diagrams

Figure 5:
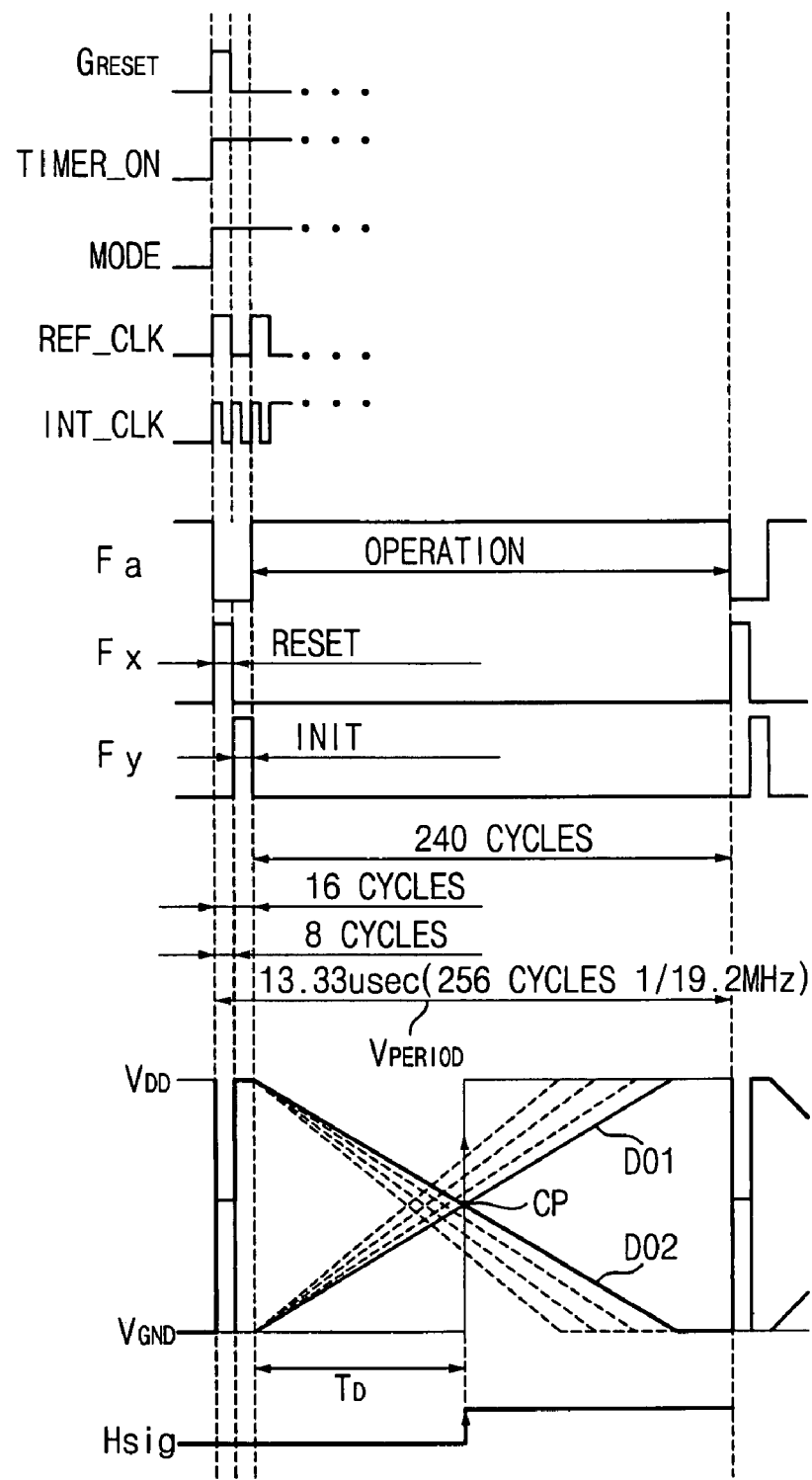
FIG. 5 is an example timing diagram illustrating operation of a RC time constant calibrator.
Figure 6:
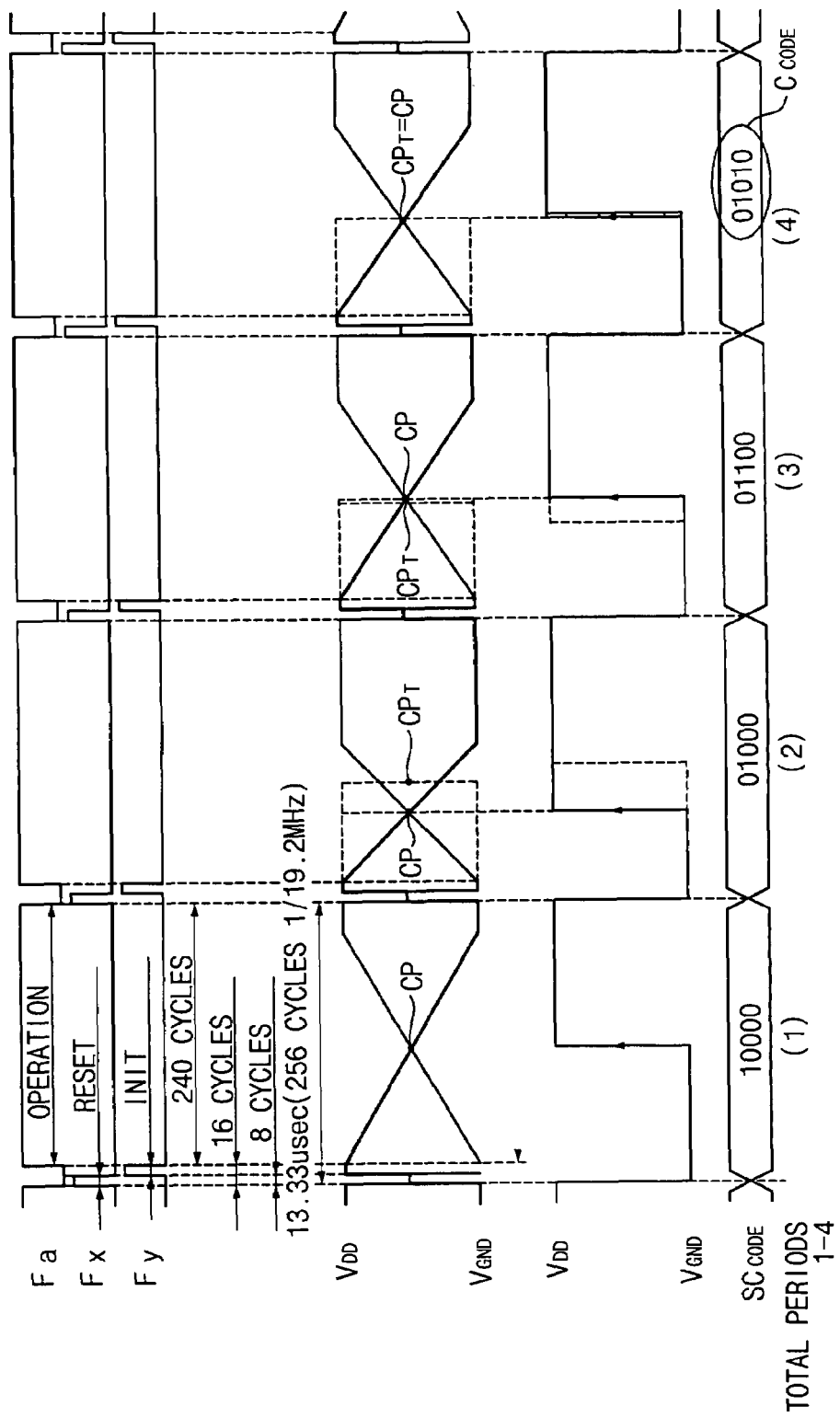
FIG. 6 is a timing diagram illustrating an example operation of a RC time constant calibrator during several periods in which a time constant calibration code is generated.

The example timing diagram of FIGS. 5 and 6 are now described to provide a more detailed explanation of the method for calibrating an active RC filter. In particular, FIG. 5 is an example timing diagram indicating how the RC timer 230 identifies a crossing point CP of the first output signal D01 and the second output signal D02.

As previously described in the clock generator section of this specification, the clock generator 210 receives an external clock signal REF_CLK and a mode signal MODE, generates an internal clock signal INT_CLK based on the external reference clock REF_CLK and the mode signal MODE, and outputs the internal clock signal INT_CLK to the N counter 220. As shown in FIG. 5, if the mode signal MODE is in a high state, the clock generator 210 generates the internal clock signal INT_CLK based on the external reference clock REF_CLK. In FIG. 5, the internal clock signal INT_CLK has a frequency approximately twice the frequency of the external reference clock REF_CLK. Further, in the example illustrated in FIG. 5, during one total period $T_{Period}$, the N counter 220 counts from 0 to 255 over a time duration of 13.33 μsec. Each count corresponds to one cycle of the internal clock signal INT_CLK and thus, each of the 256 cycles is about 0.052 μsec.

The timing diagram of FIG. 5 also shows that when the timing signal TIMER_ON provided to the RC timer 230 is a high state, the RC timer 230 functions according to the operational control signals. First, the RC timer 230 is reset in response to the reset signal $F_x$ being a high state. One instance in which the N counter 220 provides a reset signal $F_x$ in a high state to the RC timer 230 is if a global reset signal $G_{RESET}$ is provided by the reset unit 280. Further, the N counter 220 may provide a reset signal $F_x$ in a high state each time the N counter 220 finishes counting from 0 to 255. In the example of FIG. 5, the reset signal $F_x$ is in a high state for eight of the 256 cycles and thus, the reset period RESET in this instance is eight cycles. During the reset period RESET, the first and second output signals D01 and D02 of the differential amplifier 320 are reset, and the first slope capacitor 330 and the second slope capacitor 340 are discharged because the first through fourth reset switches 361-364 are closed.

After the reset period RESET, the reset signal $F_x$ transitions to a low state, and the initialization signal $F_y$ transitions to a high state and maintains this high state throughout an initialization period INIT of eight cycles, for example. During the initialization period INIT, the first through eighth initialization switches 371-378 are closed. Because the first through eight initialization switches 371-378 are closed, the first output signal Do1 is set to ground $V_{GND}$ and the second output signal D02 is set to the supply voltage $V_{DD}$.

After the initialization period INIT, the operation period OPERATION begins in response to operation signal $F_a$ transitioning to a high state and the initialization signal $F_y$ transitioning to a low state. During the operation period OPERATION, the reset signal $F_x$ is maintained in a low state. In this example, all of the first through fourth operational switches 381-384 are closed; thereby allowing the inverting input of the operational amplifier 320 to receive the first reference voltage $V_{REFM}$, allowing the non-inverting input of the operational amplifier 320 to receive the second reference voltage $V_{REFP}$, and causing the feedback loops including the first slope capacitor 330 and second slope capacitor 340, respectively, to be completed.

As shown in FIG. 5, during the operation period OPERATION, the RC timer 230 integrates the first reference voltage $V_{REFM}$ and the second reference voltage $V_{REFP}$ to provide the first output signal D01 and the second output signal D02 to the holding signal generator 350. The integration of the first reference voltage $V_{REFM}$ and the second reference voltage $V_{REFP}$ results in the first output signal D01 output from the non-inverting output terminal having a positive slope and the second output signal D02 output from the inverting output terminal having a negative slope. As such, the slope of the first output signal D01 is inversely related to the slope of the second output signal D02. This inverse relationship is also indicated in Equations (3) and (4) below.

$$V_{DO1}(t) = V_{GND} + \frac{\Delta V}{RC} t \qquad (3)$$

In Equation 3, $V_{DO1}$ represents the voltage value of the first output signal D01; t represents the time or cycle the voltage value represents; $V_{GND}$ represent the ground voltage; R represents the resistance value of the resistor R connected to the non-inverting input terminal of the differential amplifier 320; C represents the capacitance value of the first slope capacitor 330; and $\Delta V$ represents one half of the voltage difference between the first reference voltage $V_{REFP}$ and the second reference $V_{REFM}$, i.e., $\Delta V=(V_{REFP}-V_{REFM})/2$.

$$V_{DO2}(t) = V_{DD} - \frac{\Delta V}{RC} t \qquad (4)$$

In Equation 4, $V_{DO2}$ represents the voltage value of the second output signal D02; t represents the time or cycle the voltage value represents; $V_{DD}$ represents the supply voltage; R represents the resistance value of the resistor R connected to the inverting input terminal of the differential amplifier 320; C represents the capacitance value of the second slope capacitor 340; and $\Delta V$ represents one half of the voltage difference between the first reference voltage $V_{REFP}$ and the second reference $V_{REFM}$, i.e., $\Delta V=(V_{REFP}-V_{REFM})/2$.

Further, during the operation period OPERATION, the RC timer 230 identifies a crossing point CP of the first output signal D01 and the second output signal D02. In particular, during each clock cycle t, the holding signal generator 350 compares a value $V_{DO1}(t)$ of the first output signal D01 with a value $V_{DO2}(t)$ of the second output signal D02 and outputs the holding signal $H_{sig}$. As shown in FIG. 5, before the crossing point CP, the values of the first output signal D01 are less than the values of the second output signal D02. As such, the holding signal generator 350 outputs a holding signal $H_{sig}$ having a low state. The holding signal generator 350 outputs the holding signal $H_{sig}$ having a low state for a time duration $T_D$ of the operation period OPERATION. At the crossing point CP, the value of the first output signal D01 is equal to the value of the second output signal D02. After the time duration $T_D$, the value of the first output signal D01 is greater than the value of the second output signal. Accordingly, the holding signal $H_{sig}$ transitions from a low state to a high state at crossing point CP, which occurs after the time duration $T_D$ and maintains the high state for the remainder of the operation period OPERATION.

Equations (5)-(7) provide a mathematical representation of the information illustrated in FIG. 5 and relating to the time duration $T_D$.

$$V_{DO1}(T_D) = V_{DO2}(T_D) = V_{GND} + \frac{\Delta V}{RC} T_D = V_{DD} - \frac{\Delta V}{RC} T_D \qquad (5)$$

$$\frac{2\Delta V}{RC} T_D = V_{DD}(V_{GND} = 0) \qquad (6)$$

$$T_D = \frac{V_{DD}}{2\Delta V} RC = \frac{V_{DD}}{V_{REFP} - V_{REFM}} RC \qquad (7)$$

As illustrated in Equation 7, the time duration $T_D$ is proportional to the capacitance of the first and second slope capacitors 330 and 340. The dashed lines in FIG. 5 also illustrate this relationship. In particular, the dashed lines during the operation period OPERATION indicate how the slope of the first output signal D01 and the slope of the second output signal D02 vary depending on the capacitance value of the first and second slope capacitors 330 and 340, which as previously indicated vary according to a received slope control code $SC_{CODE}$. As the slope of the first output signal D01 and the slope of second output signal D02 become closer to zero, the time duration $T_D$ increases.

FIG. 6 is an example operation of the RC timer 230 during several periods, i.e., 4 total periods $T_{Periods1-4}$ in which a time constant calibration code $C_{CODE}$ is generated by the calibration code generator 290. According to the example illustrated in FIG. 6, the calibration code generator 290 performs an iterative process, wherein a plurality of bits of the time constant calibration code $C_{CODE}$ are set in an order proceeding from the most significant bit (MSB) to the least significant bit (LSB).

In the example illustrated in FIG. 6, the target crossing point $CP_T$, which is associated with the digital target value stored in the second N-bit register 244, is identified and a corresponding time constant calibration code $C_{CODE}$ is output to the RC filter 120. In this example, the slope control codes $SC_{CODE}$ have four bits and one bit of the slope control $SC_{CODE}$ is set during each of the four total periods shown in FIG. 6.

During the initialization period INIT of the first total period $T_{Period1}$, the calibration code adjusting unit 260 provides a first slope control code $SC_{CODE1}$ of 1000 to the first and second slope capacitors 330 and 340 of the RC timer 230 and to the M-bit register 270. The M-bit register 270 stores the first slope control code $SC_{CODE1}$ of 1000 until the M-bit register 270 receives a second slope control code $SC_{CODE2}$, which may overwrite the first slope control code $SC_{CODE1}$, or until the M-bit register 270 receives a flag signal FLAG instructing the M-bit register 270 to transfer the stored slope control code $SC_{CODE}$ as the calibration code $C_{CODE}$ to the RC filter 120. In the RC timer 230, the capacitance value of the first slope capacitor 330 and the capacitance value of the second slope capacitor 340 are set according to the first slope control code $SC_{CODE1}$ of 1000 (step S100 of FIG. 4).

During each cycle t of the operation period of the first total period $T_{Period1}$, the holding signal generator 350 of the RC timer 230 compares a value $V_{D01}(t)$ of the first output signal D01 of the differential amplifier 320 with a value $V_{D02}(t)$ of the second output signal D02 of the differential amplifier 320. The holding signal generator 350 outputs a holding signal $H_{sig}$ having a low value until the crossing point CP is identified in the $T_{Period1}$ (step S200 of FIG. 4). As previously indicated, the crossing point CP corresponds to a point when the value $V_{D01}(t)$ is equal to the value $V_{D02}(t)$. At the crossing point CP, the holding signal $H_{sig}$ transitions from a low to high state as previously shown in FIG. 5.

The holding signal $H_{sig}$ transitioning from the low state to the high state causes the first N-bit register 242 to output the N-bit register value to the comparator 246. The comparator 246 then compares the register value of the first N-bit register 242, which is the count value CNT at the crossing point CP, to the digital target value of the second N-bit register 244. Based on this comparison, the comparator 246 outputs a comparison signal Ak to the flag register 250 and the calibration code adjusting unit 260.

Because the target crossing point $CP_T$ value in this example is assumed to correspond to the time constant calibration code $C_{CODE}$ 0101 and the first slope control code $SC_{CODE1}$ provided by the calibration code adjusting unit 260 was 1000, the comparison signal Ak output by the comparator 246 to the flag register 250 and calibration code adjusting unit 260 indicates the value of the second N-bit register 244 is less than the value of the first N-bit register 242 (step S300 of FIG. 4). As such, the flag signal FLAG provided to the RC timer 230 allows the first slope capacitor 330 and the second slope capacitor 340 to continue to vary based on a received slope calibration code.

In response to the comparison value Ak received from the comparator 246 indicating the value of the second N-bit register 244 is less than the value of the first N-bit register 242, the calibration code adjusting unit 260 adjusts the first bit of the second slope control code $SC_{CODE2}$ to a 0 and generates a second slope control code $SC_{CODE2}$ beginning with a 0 (step S400 of FIG. 4). In the example illustrated in FIG. 5, the second slope control $SC_{CODE2}$ generated by the calibration code adjusting unit 260 and provided to the first slope capacitor 330 and the second slope capacitor 340 of the RC timer 230, as well as the M-bit register 270 is 0100.

During the initialization period INIT of the second total period $T_{Period2}$, the capacitance value of the first slope capacitor 330 and the capacitance value of the second slope capacitor 340 are reset according to the second slope control code $SC_{CODE2}$ of 0100 (step S100 of FIG. 4).

During each cycle t of the second operation period, the holding signal generator 350 of the RC timer 230 compares a value $V_{D01}(t)$ of the first output signal D01 with a value $V_{D02}(t)$ of the second output signal D02 of the differential amplifier 320. The holding signal generator 350 outputs a holding signal $H_{sig}$ having a low value until the crossing point CP is identified in the second total period $T_{Period2}$ (step S200 of FIG. 4). After the time duration $T_D$ of the second operation period, which corresponds to the crossing point CP, the holding signal $H_{sig}$ transitions from a low state to a high state.

The holding signal $H_{sig}$ transitioning from the low state to the high state again causes the first N-bit register 242 to output the N-bit register value to the comparator 246. The comparator 246 then compares the register value of the first N-bit register 242 corresponding to the crossing point CP to the digital target value of the second N-bit register 244. Based on this comparison, the comparator 246 outputs a comparison signal Ak to the flag register 250 and the calibration code adjusting unit 260. Because the target crossing point $CP_T$ in this example is assumed to correspond to the slope control code $SC_{CODE}$ of 0101 and the second slope control code $SC_{CODE2}$ provided by the calibration code adjusting unit 260 was 0100, the comparison signal Ak output by the comparator 246 to the flag register 250 and calibration code adjusting unit 260 indicates the value of the second N-bit register 244 is greater than the value of the first N-bit register 242 (step S300 of FIG. 4). As such, the flag signal FLAG provided to the RC timer 230 continues to vary the capacitance values of the first slope capacitor 330 and the second slope capacitor 340 based on a received slope calibration code.

In response to the comparison value Ak received from the comparator 246 indicating the value of the second N-bit register 244 is greater than the value of the first N-bit register 242, the calibration code adjusting unit 260 generates a third slope control $SC_{CODE3}$, wherein the first and second bits of the third slope control code $SC_{CODE3}$ are 01. In the example illustrated in FIG. 5, the third slope control $SC_{CODE3}$ generated by the calibration code adjusting unit 260 and provided to the first slope capacitor 330 and the second slope capacitor 340 of the RC timer 230 as well as the M-bit register 270 is 0110.

During the initialization period of the third total period $T_{Period3}$, the capacitance value of the first slope capacitor 330 and the capacitance value of the second slope capacitor 340 are reset according to the third slope control code $SC_{CODE3}$ of 0110 (step S100 of FIG. 4).

During each cycle t of the third operation period, the holding signal generator 350 of the RC timer 230 again compares a value $V_{D01}(t)$ of the first output signal D01 with a value $V_{D02}(t)$ of the second output signal D02 of the differential amplifier 320. The holding signal generator 350 outputs a holding signal $H_{sig}$ having a low value until the crossing point CP is identified (step S200 of FIG. 4) in the third operation period. At the crossing point CP, the holding signal $H_{sig}$ transitions from a low to high state.

The holding signal $H_{sig}$ transitioning to the high state again causes the first N-bit register 242 to output the N-bit register value to the comparator 246. The comparator 246 then compares the register value of the first N-bit register 242 to the digital target value of the second N-bit register 244. Based on this comparison, the comparator 246 outputs a comparison signal Ak to the flag register 250 and the calibration code adjusting unit 260. Because the target crossing point $CP_T$ in this example is assumed to correspond to the time constant control code $C_{CODE}$ 0101 and the third slope control code $SC_{CODE3}$ provided by the calibration code adjusting unit 260 was 0110, the comparison signal Ak output by the comparator 246 to the flag register 250 and calibration code adjusting unit 260 indicates the value of the second N-bit register 244 is less than the value of the first N-bit register 242 (step S300 of FIG. 4). As such, the flag signal FLAG provided to the RC timer 230 continues to vary the capacitance values of the first slope capacitor 330 and the second slope capacitor 340 based on a received slope calibration code.

In response to the comparison value Ak received from the comparator 246 indicating the value of the second N-bit register 244 is less than the value of the first N-bit register 242, the calibration code adjusting unit 260 generates a fourth slope control $SC_{CODE4}$, wherein the first three bits of the fourth slope control code $SC_{CODE4}$ are 010. In the example illustrated in FIG. 5, the fourth slope control code $SC_{CODE4}$ generated by the calibration code adjusting unit 260 and provided to the first slope capacitor 330 and the second slope capacitor 340 of the RC timer 230 as well as the M-bit register 270 is 0101.

During the initialization period of the fourth total period $T_{Period4}$, the capacitance value of the first slope capacitor 330 and the capacitance value of the second slope capacitor 340 are reset according to the fourth slope control code $SC_{CODE4}$ of 0101 (step S100 of FIG. 4).

During each cycle t of the fourth operation period, the holding signal generator 350 of the RC timer 230 again compares a value $V_{D01}(t)$ of the first output signal D01 with a value $V_{D02}(t)$ of the second output signal D02 of the differential amplifier 320. The holding signal generator 350 outputs a holding signal $H_{sig}$ having a low value until the crossing point CP is identified (step S200 of FIG. 4). At the time $T_D$, the holding signal $H_{sig}$ transitions from a low to high state.

The holding signal $H_{sig}$ being a high state again causes the first N-bit register 242 to output the N-bit register value to the comparator 246. The comparator 246 then compares the register value of the first N-bit register 242 to the digital target value of the second N-bit register 244. Based on this comparison, the comparator 246 outputs a comparison signal Ak to the flag register 250 and the calibration code adjusting unit 260. Because the digital target value in this example is assumed to correspond to the slope control code $SC_{CODE}$ of 0101 and the fourth slope control code $SC_{CODE4}$ provided by the calibration code adjusting unit 260 was 0101, the comparison signal Ak output by the comparator 246 to the flag register 250 and calibration code adjusting unit 260 indicates the digital target value of the second N-bit register 244 is equal to the value of the first N-bit register 242 (step S300 of FIG. 4). As such, the flag signal FLAG provided by the flag register 250 prevents the capacitance value of the first slope capacitor 330 and capacitance value of the second slope capacitor 340 from varying based on a received slope calibration code.

Further, the flag signal FLAG causes the M-bit register 270 storing the fourth slope control code $SC_{CODE4}$ to output the fourth slope control code $SC_{CODE4}$ as the time constant calibration code $C_{CODE}$ to the RC filter 120.

VIII. Example System Including RC Time Constant Calibrator

Figure 7:
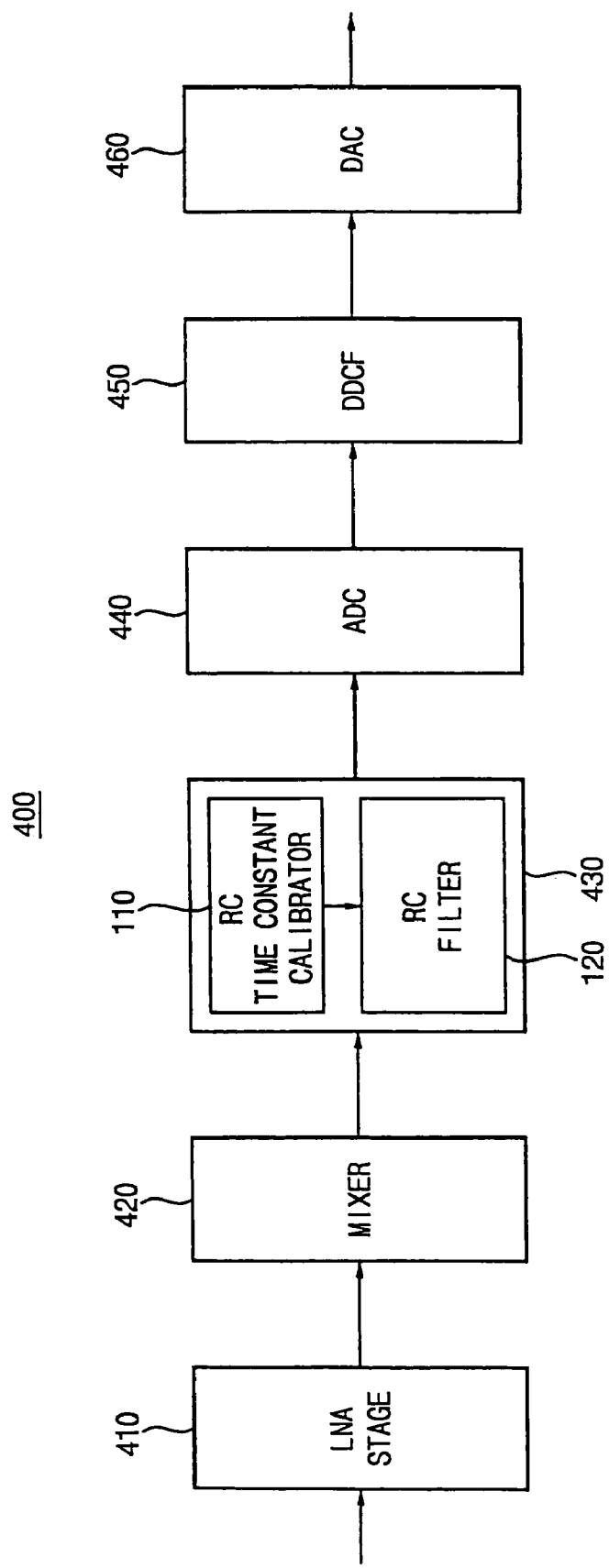
FIG. 7 illustrates an example embodiment of a mobile communication device including a RC time constant calibrator that provides a time constant calibration code to a RC filter.

Example embodiments of the RC time constant calibrator 110 and the active RC filter 120 may be included in various different systems and/or devices such as a mobile communication integrated circuit (IC) device, for example. FIG. 7 is an example block diagram of a mobile communication IC device 400. In particular, the mobile communication IC device 400 may be a GSM/GPRS/EDGE receiver including the RC time constant calibrator 110 and the active RC filter 120.

As shown in FIG. 7, the mobile communication device 400 includes a low noise amplifier (LNA) stage 410, a mixer 420, a filtering stage 430, an analog to digital conversion stage (ADC) 440, a digital down conversion and filtering (DDCF) stage 450 and a digital to analog conversion (DAC) stage 460. Specific components of the LNA stage 410, the mixer 420, the ADC stage 440, the DDCF stage 450 and the DAC stage 460 are well-known in the art and are only be discussed briefly below.

Referring to FIG. 7, one or more RF input signals may enter the mobile communication device 400 via the LNA stage 410. After amplification, the one or more amplified signals are provided to the mixer 420. In the mixer 420, the one or more amplified signals are mixed with a local oscillator to create one or more mixed signals having a desired and/or predetermined frequency. The one or more mixed signals are then provided to the filtering stage 430. The filtering stage 430 includes at least one RC filter 120 and at least one RC time constant calibrator 110 according to an example embodiment. The at least one RC time constant calibrator 110 operates to calibrate the RC filter 120 as described above with respect to FIGS. 4-6 and thus, the description will not be repeated herein for the sake of brevity. The at least one RC filter 120 filter the one or more mixed signals and provides the filtered signals to the ADC stage 440. The ADC stage 440 converts the received filtered signals into digital signals, which are then down converted and filtered in the DDCF stage 450. The one or more signals processed by the DDCF stage 450 are then provided to the DAC stage 460 and may be output as an analog in-phase baseband signal and a quadrature baseband signal, for example. FIG. 7 is just one example of a system including an example embodiment of the RC time constant calibrator 110 and thus, one skilled in the art will appreciate that this example system is not intended to limit this disclosure.

As previously described, example embodiments provide an improved time RC time constant calibrator and related method. While this invention has been particularly shown and described with reference to example embodiments of the present invention, it will be understood by those skilled in the art that various changes in form and details may be made therein without departing from the spirit and scope of the invention as defined by the appended claims.

What is claimed is:

1. A RC time constant calibrator for an active RC filter comprising:

a RC timer outputting a holding signal based on a comparison of a first output signal and a second output signal, the first output signal and the second output signal being amplified signals corresponding to a first reference voltage and a second reference voltage, respectively, each of the first output signal and the second output signal having a slope, the holding signal causing a digital count value to be compared to a digital target value; and a calibration code generator generating a slope control code and a flag signal based on a comparison of the digital count value and the digital target value and outputting the slope control code as a calibration code based on the flag signal indicating the digital count value corresponds to the digital target value, the slope control code controlling the slope of the first output signal and the slope of the second output signal to adjust the digital count value compared to the digital target value.

2. The RC time constant calibrator of claim 1, wherein the slope of the first output signal is inversely related to the slope of the second output signal and the first output signal Intersects with the second output signal at a crossing point.

3. The RC time constant calibrator of claim 2, wherein the RC timer includes,
   a reference voltage generator generating the first reference voltage and the second reference voltage from a supply voltage,
   a differential amplifier receiving the first reference voltage and the second reference voltage and outputting the first output signal and the second output signal,
   a first slope capacitor varying the slope of the first output signal,
   a second slope capacitor varying the slope of the second output signal, and
   a holding signal generator comparing the first output signal and the second output signal and outputting the holding signal based on an output signal comparison result.

4. The RC time constant calibrator of claim 3, wherein a difference between the first reference voltage and the second reference voltage is maintained at a constant value.

5. The RC time constant calibrator of claim 3, wherein the crossing point is varied according to a capacitance value of each of the first slope capacitor and the second slope capacitor.

6. The RC time constant calibrator of claim 5, wherein the capacitance value of each of the first slope capacitor and the second slope capacitor are maintained if the flag signal is in a first state; and
   the capacitance value of each of the first slope capacitor and the second slope capacitor are varied according to the slope control code if the flag signal is in a second state.

7. The RC time constant calibrator of claim 3, wherein,
   the holding signal generator compares a value of the first output signal with a value of the second output signal for each cycle of a time period, outputs the holding signal in a first state if the compared value of the first output signal is less than a compared value of the second output signal, outputs the holding signal in a second state if the compared value of the first output signal is equal or greater than the compared value of the second output signal, and
   the calibration code generator sets the digital count value when the received holding signal transitions from the first state to the second state, which occurs at the crossing point, compares the set digital count value with the digital target value, generates the flag signal and the slope calibration code based on the comparison of the set digital count value and the digital target value.

8. The RC time constant calibrator of claim 7, wherein the calibration code generator generates a new slope control code to control the slope of the first output signal and the slope of the second output signal if the set digital count value does not match the digital target value, and
   the calibration code generator outputs the slope control as the calibration code if the set digital count value matches the digital target value.

9. The RC time constant calibrator of claim 1, wherein the calibration code generator includes,
   a target identifying component receiving the holding signal, the digital count value being based on an internal clock, and the digital target value, setting the digital count value based on the holding signal, comparing the set digital count value with the digital target value, and outputting a count value comparison result,
   a calibration code adjusting component generating the slope control code based on the count value comparison result and outputting the slope control code to adjust the slope of the first output signal and the slope of the second output signal,
   a first register storing the slope control code received from the calibration code adjusting unit and outputting the slope control code as a calibration code based on the flag signal, and
   a flag register outputting the flag signal to stop adjusting the slope of the first output signal and the slope of the second output signal and to instruct the first register to output the slope control code as the calibration code.

10. The RC time constant calibrator of claim 9, wherein the target identifying component includes,
    a second register receiving the holding signal and the digital count value, the digital count value being set based on the holding signal transitioning from a first state to a second state, and outputting the set digital count value,
    a third register receiving and storing the digital target value,
    a comparator comparing the set digital count value received from the second register with the digital target value received from the third register and outputting the count value comparison result to the calibration code adjusting component and the flag register.

11. The RC time constant calibrator of claim 10, wherein,
    the flag signal generated by the flag register has a first state causing the calibration code adjusting unit to generate a new slope control code to control the slope of the first output signal and the slope of the second output signal, if the set digital count value does not match the digital target value; and
    the flag signal generated by the flag register causes the first register to output the slope control code stored in the first register as the calibration code, if the set digital count value matches the digital target value.

12. The RC time constant calibrator of claim 1, wherein the calibration code is output to the active RC filter.

13. A RC timer comprising:
    a reference voltage generator generating a first reference voltage and a second reference voltage from a supply voltage;
    a differential amplifier receiving the first reference voltage and the second reference voltage and outputting a first output signal and a second output signal, the first output signal and the second output signal being amplified signals corresponding to the first reference voltage and the second reference voltage, respectively;
    a first slope capacitor varying a slope of the first output signal;
    a second slope capacitor varying a slope of the second output signal; and
    a holding signal generator comparing the first output signal and the second output signal and outputting a holding signal based on an output signal comparison result.

14. The RC timer of claim 13, further comprising:
    a first initialization switching unit configured to set the first output signal to a ground during an initialization period; and
    a second initialization switching unit configured to set the second output signal to the supply voltage during the initialization period.

15. The RC timer of claim 14, wherein the first initialization switching unit includes, a first initialization switch connected between a non-inverting output terminal of the differential amplifier and a non-inverting input terminal of the differential amplifier, a third initialization switch connected between a first terminal of the first slope capacitor and the supply voltage, a fourth initialization switch connected between a second terminal of the first slope capacitor and the ground, and a fifth initialization switch connected between the non-inverting output terminal of the differential amplifier and the ground, and wherein the second initialization switching unit includes, a second initialization switch connected between an inverting output terminal of the differential amplifier and an inverting input terminal of the differential amplifier, a sixth initialization switch connected between a first terminal of the second slope capacitor and the ground, a seventh initialization switch connected between a second terminal of the second slope capacitor and the ground, and an eighth initialization switch connected between the inverting output terminal of the differential amplifier and the supply voltage.

16. A calibration code generator of a calibrator, comprising:

target identifying component receiving a holding signal, a digital count value being based on an internal clock, and a digital target value, setting the digital count value based on the holding signal; comparing the stored digital count value with the digital target value, and outputting a count value comparison result;

a calibration code adjusting component generating a slope control code based on the count value comparison result and outputting the slope control code;

a first register storing the slope control code received from the calibration code adjusting component and outputting the slope control code as a calibration code; and a flag register outputting a flag signal to instruct the first register to output the slope control code as the calibration code.

17. A method for calibrating an active RC filter, the method comprising:

varying a slope of a first output signal and a slope of a second output signal, the first output signal and the second output signal being amplified signals corresponding to a first reference voltage and a second reference voltage, respectively, the slope of the first output signal being inversely related to the slope of the second output signal, and the first output signal intersecting with the second output signal at a crossing point;

identifying the crossing point of the first output signal and the second output signal;

determining if the identified crossing point matches a target point corresponding to a digital target value; and providing a calibration code to the active RC filter if the crossing point matches the target point.

18. The method of claim 17, further comprising:

receiving the first reference voltage and the second reference voltage, a difference between the first reference voltage and the second reference voltage is a constant value;

generating the first output signal and the second output signal based on the first reference voltage and the second reference voltage.

19. The method of claim 17, wherein varying the slope of the first output signal and the slope of the second output signal includes, generating a slope control code, and changing the slope of the first output signal and the slope of the second output signal based on the slope control code to adjust the crossing point of the first output signal and the second output signal.

20. The method of claim 17, wherein the varying and the identifying are repeated until the determining determines the crossing point matches the target point.

21. The method of claim 17, further comprising:

comparing a value of the first output signal and a value of the second output signal during each cycle of a time period;

outputting a holding signal, the holding signal being in a first state if a compared value of the first output signal is less than a compared value of the second output signal, the holding signal being in a second state if the compared value of the first output signal is greater than the compared value of the second output signal; and the identifying step identifying the crossing point as occurring at a time when the holding signal transitions from the first state to the second state.

22. The method of claim 21, wherein the determining includes, comparing a digital count value corresponding to the identified crossing point with the digital target value, outputting a count value comparison result based on the comparison of the digital count value and the digital target value, and generating a flag signal based on the count value comparison result, the flag signal being in a first state indicating the crossing point matches the target point if the count value comparison result indicates the digital count value and the digital target value are equal and a second state indicating the crossing point does not match the target point if the count value comparison result indicates that the digital count value and the target digital value are not equal.

23. The method of claim 22, wherein the providing provides the calibration code to the active RC filter if the flag signal is in the first state.

24. A communication device comprising:

a receiving stage receiving at least one signal; and a filtering stage filtering the at least one signal and outputting at least one filtered signal, wherein the filtering stage includes an active RC filter and a calibrator, the calibrator varies a slope of a first output signal and a slope of a second output signal, which are inversely related, and respectively correspond to a first reference voltage and a second reference voltage, identifies a crossing point of the first output signal and the second output signal, determines if the identified crossing point matches a target point corresponding to a digital target value, and provides a calibration code to the active RC filter if the crossing point matches the target point, the active RC filter filters the received at least one signal based on the calibration code received from the calibrator.

* * * * *